(12) United States Patent
Khlat et al.

(10) Patent No.: US 7,046,977 B2
(45) Date of Patent: May 16, 2006

(54) APPARATUS FOR GENERATING MULTIPLE CLOCK SIGNALS OF DIFFERENT FREQUENCY CHARACTERISTICS

(75) Inventors: Nadim Khlat, Toulouse (FR); Cor Voorwinden, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 9 days.

(21) Appl. No.: 10/496,524

(22) PCT Filed: Nov. 4, 2002

(86) PCT No.: PCT/EP02/12270

§ 371 (c)(1),
(2), (4) Date: Oct. 13, 2004

(87) PCT Pub. No.: WO03/044952

PCT Pub. Date: May 30, 2003

(65) Prior Publication Data

US 2005/0042996 A1 Feb. 24, 2005

(30) Foreign Application Priority Data

Nov. 19, 2001 (EP) .................................. 01402965

(51) Int. Cl.
*H04B 1/06* (2006.01)
*H04B 7/00* (2006.01)

(52) U.S. Cl. ...................... 455/260; 455/141; 455/146; 455/147; 455/148; 375/215; 375/294; 375/327; 375/376

(58) Field of Classification Search ................ 455/260, 455/76, 141, 146, 147, 148, 168.1, 180.3, 455/192.2; 275/215, 294, 327, 376
See application file for complete search history.

(56) References Cited

U.S. PATENT DOCUMENTS

| 5,493,700 | A | 2/1996 | Hietala |
| 5,590,396 | A | 12/1996 | Henry |
| 5,613,235 | A | 3/1997 | Kivari |
| 5,943,613 | A * | 8/1999 | Wendelrup et al. ...... 455/343.1 |
| 6,185,411 | B1 | 2/2001 | Gillig |

(Continued)

FOREIGN PATENT DOCUMENTS

WO    WO 0036861 A    6/2000

OTHER PUBLICATIONS

PCT/EP02/12270 International Search Report.

*Primary Examiner*—Curtis Kuntz
*Assistant Examiner*—Tuan Pham

(57) ABSTRACT

A terminal includes at least one wireless communication application module (1) and a plurality of further application modules (4, 5, 6, 8). Multiple radio frequency clock signals are generated for the different modules having respective clock frequency characteristics and including at least first and second clock frequencies that are not integral multiples nor sub-multiples of each other nor of a third frequency. The clock generation comprises reference frequency means (14), fractional-N phase-locked loop frequency synthesizer means (15) responsive to the reference frequency means, and different automatic frequency control means for adjusting clock frequencies relative to received signals.

The reference frequency means (14) is arranged to supply a common reference frequency signal to a plurality of the fractional-N phase-locked loop frequency synthesizer means (17, 18, 19, 25, 26, 41,42) that supply the first and second clock frequencies respectively for the application modules. Selective activation means (30,52) selectively activates and de-activates the phase lock loop means as required by the corresponding application module or modules.

24 Claims, 11 Drawing Sheets

U.S. PATENT DOCUMENTS

| | | |
|---|---|---|
| 6,188,285 B1 | 2/2001 | Nakanishi |
| 6,249,685 B1 * | 6/2001 | Sharaf et al. ................ 455/84 |
| 6,370,360 B1 * | 4/2002 | Kunkel ....................... 455/76 |
| 6,735,426 B1 * | 5/2004 | Pau ............................ 455/255 |
| 2002/0198912 A1 * | 12/2002 | Humphreys et al. ........ 708/270 |

* cited by examiner

APPARATUS FOR GENERATING MULTIPLE CLOCK SIGNALS OF DIFFERENT FREQUENCY CHARACTERISTICS

FIELD OF THE INVENTION

This invention relates to clock signal generation and, more particularly, to the generation of multiple clock signals of different frequency characteristics for portable wireless communication terminals having more than one application capability. The term clock signals, as used herein, is to be understood as including sinusoidal, square-wave and other shaped signals defining a frequency and/or phase reference as well as to pulse clock signals and the term radio frequency is used herein to refer to frequencies exceeding approximately 1 MHz.

BACKGROUND OF THE INVENTION

End user terminals for wireless communication systems (including radio and television) and portable cellular phones should be small, lightweight and inexpensive and have low power consumption.

The first generation of cellular telephone systems relied on analogue frequency modulation for speech transmission, and several standards have been developed, such as NMT450, NMT900, AMPS, and ETACS. The second generation of cellular systems is based on three different standards: in Europe and some countries in Asia and Australia—Global System For Mobile Communications (GSM), in north America—American Digital Cellular (ADC), and in Japan—Pacific Digital Cellular (PDC). These second generation systems all employ digital transmission for voice and data, including some digital services such as facsimile transmission and short messages. To make the portable terminals smaller and less expensive they make extensive use of integrated circuits. Most user terminals for $1^{st}$ and $2^{nd}$ nd generation systems are simple telephone terminals operating with a single telephone system and with limited data processing capability, such as personal data assistants (PDA's—diary, reminder, notebook) and simple games.

A wireless telephone user terminal (or handset) for GSM is described in U.S. Pat. No. 5,493,700, assigned to the assignee of the present invention. This user terminal includes a reference frequency generator comprising a crystal resonator supplying a fractional-N phase-locked loop frequency synthesizer, the frequency being corrected by synchronisation relative to a frequency of the received wireless communication signal.

Communication systems are now being prepared according to a third generation of standards. Among $3^{rd}$ generation cellular standards are the UMTS 3GPP ($3^{rd}$ generation Partnership Project) and 3GPP2 standards,of the European Telecommunications Institute ('ETSI'), the International Mobile Telecommunications-2000 ('IMT-2000') standards. It is desirable for the $3^{rd}$ generation user terminals to be capable of functioning on at least the local $2^{nd}$ generation standards as well as the $3^{rd}$ generation standards, especially during the period of introduction of the $3^{rd}$ generation and until its coverage is as extensive as the $2^{nd}$ generation. However, the radio frequency ('RF') signals for the two generations are different and are not simple integer multiples or sub-multiples of each other.

In addition, the user terminals for $3^{rd}$ generation wireless telephony are inherently capable of adaptation to function with accessories (headsets, printers, or local area networks, for example) and download of media (music, speech and video over the Internet) by short-range wireless communication with the co-operating devices. The personal area network standards, such as BlueTooth, the digital-to-analogue and analogue-to-digital converters in the audio channels involved, the inclusion of powerful microprocessors and the addition of location aware services requiring wireless communication with triangulation sources, such as the Global Positioning System ('GPS'), increase very significantly the number of different, high precision radio frequency clock signals that must be generated and, especially at radio frequencies, the generation of sufficiently accurate and precise clock signals tends to be expensive and to have high power consumption levels.

Moreover, the frequency synthesizers used in the wireless transmitter and receiver stages of the different wireless communication applications often need to be synchronised separately relative to the respective received signals by automatic frequency control and the clock signals used for internal signal processing and data processing need to be controlled relative to the frequencies used in the transmitter and receiver stages. In particular, the different radio communication units in the terminal, such as GSM and WBCDMA and Bluetooth and GPS, for example need to be synchronized separately relative to the respective types of base stations, that is to say the GSM Base station, WBCDMA base station, Bluetooth master unit and GPS satellite master unit, in these examples, which are not synchronized between themselves. It is possible, but undesirable for several reasons, to provide separate crystal frequency references for the respective radio communication units, each crystal using its own automatic frequency correction to synchronize to the respective system networks separately.

The present invention provides an effective relatively low energy-consumption means of providing multiple clock frequencies. The invention is applicable to wireless telephony and also to other apparatus where multiple clock frequencies are required.

SUMMARY OF THE INVENTION

The present invention provides apparatus for generating a plurality of radio frequency clock signals as described in the accompanying claims.

DETAILED DESCRIPTION OF THE PREFERRED EMBODIMENTS

Figure 1:
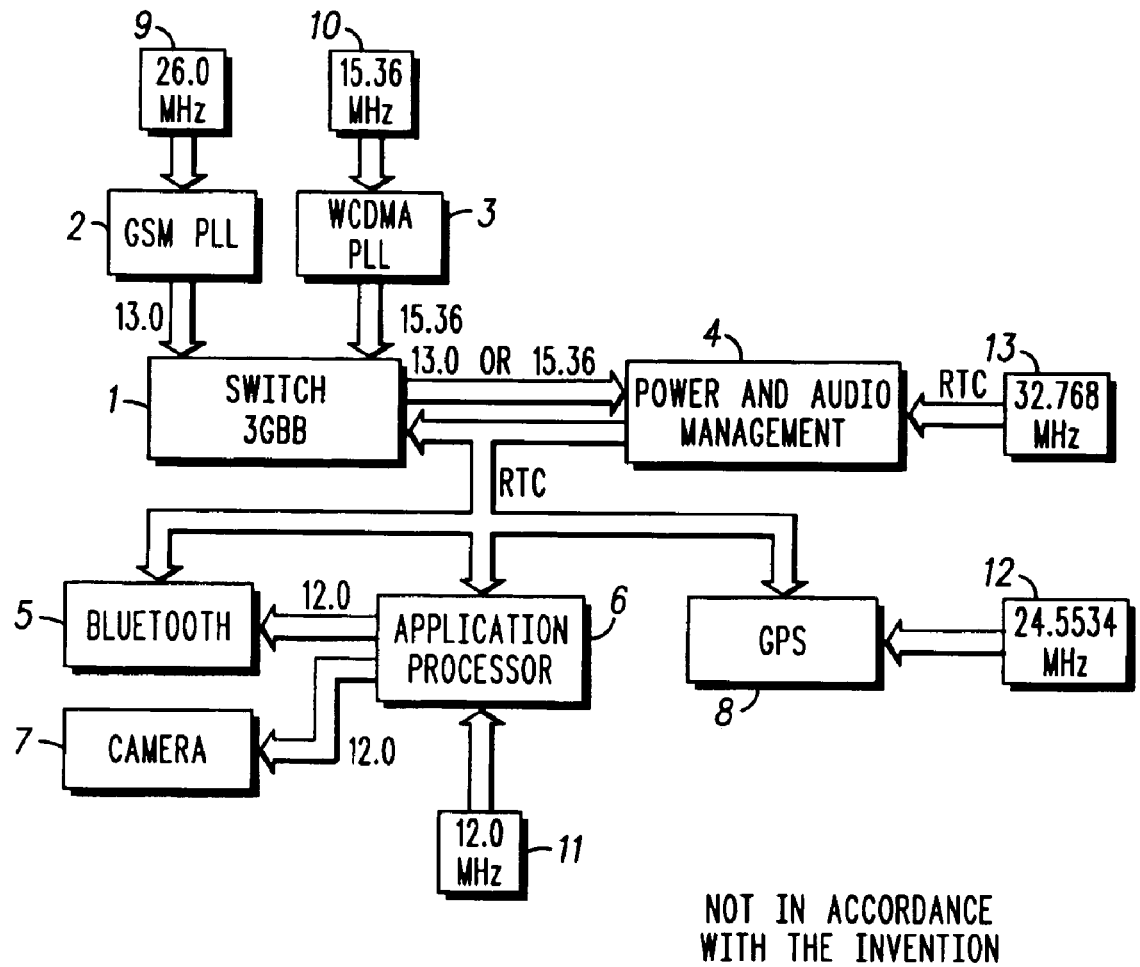
FIG. 1 is a block schematic diagram of a portable wireless communication terminal having several application capabilities, which is not in accordance with the present invention.

The embodiments of portable wireless communication terminals shown in the drawings by way of example include a base band wireless cellular telephony module 1 that processes signals at base band frequencies, adapted for operation on the $2^{nd}$ generation GSM standard and on the $3_{rd}$ generation WCDMA standard. The terminals also include modules 5 and 6 for wireless communication over a personal area network ('LAN') with other equipment and accessories in the vicinity, such as a head-set comprising ear-phones and a microphone, and a printer, for example. The application processor 6 may also provide other functions, such as games, with the possibility of communicating with other terminals. The terminals also include a GPS module 8 for wireless communication with satellites of the Global Positioning System to provide positional information. It will be appreciated that the present invention is also applicable to other wireless communication standards.

The embodiments of portable wireless communication terminals shown in the drawings by way of example also include other modules in wired connection, including a video camera 7 and audio coder/decoders ('Codecs') 38 and 39.

The power consumptions of the individual modules are substantial and it is important to be able to activate and de-activate, at least partially, the different modules as and when they are needed. The activation and de-activation can be performed manually but, especially in order to be able to provide standby modes in which the modules monitor the arrival of incoming signals or other events that require full activation of the modules and to shut the modules down at least partially during periods of inactivity, standby managers 30 and 52 are provided to activate and de-activate the modules automatically.

Referring first to FIG. 1 of the accompanying drawings, the terminal shown, which is not in accordance with the present invention, includes a base band module 1 that processes signals at base band frequencies and co-operates with a receiver and transmitter section (not shown). Frequency synthesisers 2 and 3 generate reference frequency signals respectively at 13.0 MHz for GSM communications and at 15.36 MHz for WCDMA communications. A power and audio management module 4 receives reference frequency signals at the 13.0 MHz or 15.36 MHz frequencies, according to whether communications are occurring in GSM or WCDMA standard. The terminal also includes a Blue Tooth module 5 for communication within a Personal Area Network ('PAN') with other devices and accessories, such as a head-set, a printer, a personal computer, for example. The terminal also includes an application processor module that includes control units (not shown) for controlling the operations of the other modules and that generates a reference frequency signal at 12.0 MHz, which it supplies to the Blue Tooth module 5. A video camera 7 also receives the frequency reference signal at 12.0 MHz from the application processor 6. The terminal also includes a GPS module 8 for receiving signals from the global positioning system satellites and calculating positional information by triangulation.

In order to generate different reference frequencies, the terminal includes a crystal 9 tuned to 26.0 MHz for the GSM module 2, a crystal tuned to 15.36 MHz for the WCDMA module 3, a crystal 11 tuned to 12.0 MHz for the application processor 6, the Blue Tooth module 5, and the camera 7, and a crystal 12 tuned to 24.5534 MHz for the GPS module 8. In addition to these four radio frequency tuned crystals, the terminal also includes a crystal 13 tuned to a substantially lower frequency of 32.768 kHz for the power and audio management module 4, the corresponding reference frequency also being supplied to the 3GBB module 1 and the application processor 6 for the audio channels.

The use of four radio frequency crystals in the terminal is expensive. In addition, the resulting reference frequencies are not synchronised relative to each other and this causes problems when two or more modules with different reference frequencies are co-operating together.

Figure 2:
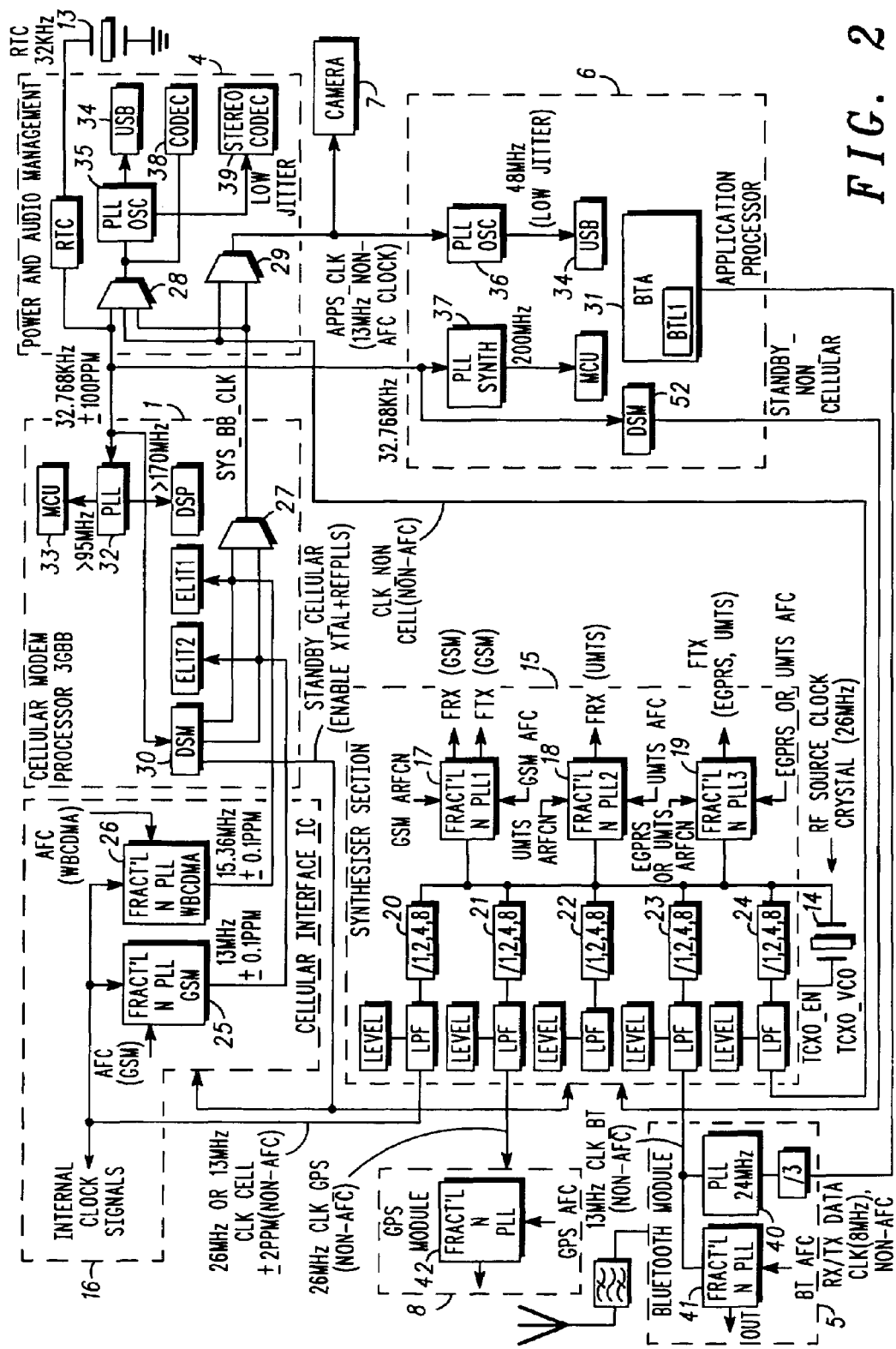
FIG. 2 is a block schematic diagram of a portable wireless communication terminal having several application capabilities in accordance with one embodiment of the present invention.

FIG. 2 shows a terminal in accordance with a preferred embodiment of the present invention, which includes modules whose functions are basically similar to those of the terminal shown in FIG. 1 and that have similar references. Thus, the terminal includes a 3G base band processor 1, a power and audio management module 4, a Blue Tooth transmitter/receiver module 5, an application processor module 6, and a video camera 7. The terminal also includes a 32.768 kHz crystal 13.

On the other hand, all the radio frequency reference frequencies and other clock signals are derived from a single, common free running crystal controlled oscillator ('VCO') 14 tuned to 26.0 MHz. The common crystal 14 is coupled to a multiple frequency synthesiser and divider module 15 that produces several reference frequency outputs with medium frequency precision (in this example +/−2 ppm). In order to obtain a higher degree of frequency precision tolerance, a cellular interface module 16 produces reference frequency signals that are corrected using automatic frequency control ("AFC") derived from the received cellular telephone signals (GSM or WCDMA) once communication has been established.

In more detail, the frequency synthesiser 15 includes frequency synthesiser elements 17, 18 and 19 that receive the frequency reference signal from the common crystal and associated oscillator 14 and produce the appropriate frequencies for reception and transmission in the cellular telephone systems as a function of the actual RF channel number ("ARFCN") and the AFC signals when available. In particular, the synthesiser element 17 generates signals for the GSM receiver and transmitter sections, the synthesiser element 18 generates clock signals for the UMTS receiver section and the synthesiser element 19 generates clock signals for the UMTS and GPRS transmitter sections.

In addition, the frequency synthesiser section 15 includes divider and low path filter elements 20 to 24 that generate sine wave signals directly from the frequency reference signal from the common crystal and associated oscillator 14. The divider element 20 generates a sinusoidal signal at 26 MHz or 13 MHz that is supplied to the cellular interface 16, the divider element 21 generates a 26 MHz sinusoidal signal that is supplied to the GPS module 8, the divider element 23 generates a 13 MHz sinusoidal signal that is supplied to the Blue Tooth module 5 and the divider element 24 generates a 13 MHz sinusoidal signal that is supplied to the power and audio management module 4. Separate divider and low path filter elements are used even where identical frequencies are generated, to avoid disturbance to the clock signal supplied to one module when a second module using the same frequency is activated or de-activated.

The cellular interface module 16 includes fractional-N PLL frequency synthesiser elements 25 and 26. The element 25 provides a 13 MHz signal for the GSM application of the 3G base band processor module 1, corrected by the AFC signal to achieve a more accurate frequency precision (±0.1 ppm in this example). The PLL synthesiser 26 converts the 13.0 MHz signal from the divider element 20 to 15.36 MHz and corrects by the AFC signal from WCDMA communication when available. The square wave signals from the cellular interface module 16 are supplied to the cellular modem processor module 1, where they are used to time the protocol for frame reception and transmission of the cellular telephone communications.

The clock signals from the synthesiser elements 25 and 26 are also supplied to a multiplexer 27 in the 3G base band processor 1 that selects the signal corresponding to the mode of operation (GSM or WCDMA) of the processor 1 and supplies the corresponding signal to multiplexers 28 and 29 in the power and audio management module 4. The multiplexers 28 and 29 also receive the clock signal from the divider element 24 of the synthesiser section 15 and the multiplexer 29 also receives the 32 kHz signal from the crystal and oscillator 13.

The 3G base band processor 1 and the frequency synthesiser elements 17, 18 and 19 of the synthesiser section 15 and 25, 26 of the cellular interface 16 have relatively high power consumption. Accordingly, in addition to the full operational mode, in which all these elements are normally supplied with power, and an "off" mode in which all these elements are de-activated, so that they are switched off and their power consumption is substantially zero, a stand-by or "monitoring" mode is provided in which the relevant element or elements are activated only intermittently to check for the reception of wireless signals, this mode being controlled automatically or possibly manually by deep sleep manager elements 30 in the 3G base band processor 1 and 52 in the application processor module 6 (to manage the standby modes of the other modules even when the other deep sleep manager is off. In cellular telephone operation, when the 3GBB applications are on, the deep sleep manager 30 or 52 activates the cellular interface 16 and the synthesiser elements 17 to 19. When the 3G applications are off, in the absence of an activation signal from the processor 1 or 6, the cellular interface 16 and the synthesiser elements 17 to 19 are put in battery save mode. In stand-by mode, the deep sleep manager 52 is energised and intermittently activates the cellular interface 16 in response to received wireless signals, the synthesiser elements 17 to 19 being continuously activated. In order to enable the Blue Tooth clock signal to be generated for the Blue Tooth module when the 3G applications are not activated, a further stand-by control signal is generated by a Blue Tooth application module 31 in the application processor 6 and applied to the synthesiser section 15 to enable the crystal and oscillator 14 and divider 23 to produce the clock signal for the Blue Tooth module 5.

The processor 1 also generates higher frequency clock signals for a digital signal processor 32 at 170 MHz, a micro controller unit 33 at more than 95 MHZ and a universal serial bus ("USB") 34 at 48 MHz. The processor 1, synthesiser section 15 and cellular interface 16 also generate clock signals for internal functions. All these clock signals are derived ultimately from the common crystal oscillator 14.

In order to supply the USB when the processor 1 is de-activated, a PLL oscillator 35 is provided in the power and audio management module 4 and a PLL oscillator 36 is provided in the application processor 6. A PLL oscillator 37 in the application processor 6 also generates a clock signal at 200 MHz from the low frequency 32.768 kHz clock signal.

In partial operation, stand-by or enable control signals from the application processor can activate and de-activate further elements within the synthesiser section 15, and even the reference frequency generator 14 including the common RF crystal, to minimise power consumption and additionally, the stand-by control signal from the deep sleep manager 30 or 52 may be arranged to activate one only of the synthesiser elements 25 and 26 and the cellular interface 16 to avoid the power consumption of both elements when the portable terminal is operating in a single mode.

The power and audio management module 4 controls the multiplexers 28 and 29 to select the source for the clock signal that is applied to a coder/decoder element ("CODEC") element 37 for voice communication and another clock signal that is applied to a stereo CODEC (for high fidelity sound) 38. The multiplexer 29 selects the clock signal from multiplexer 27 to generate an AFC corrected clock signal when operating in voice mode communication either in GSM or WCDMA or the clock signal from divider 24 in the synthesiser 15 which is not AFC when operating in play back mode from wire connected or internal memory sources or when no cellular telephony application is running. The clock signal from divider 24 typically has less than 100 ps of jitter in this example which enables the PLO 35 to generate a low jitter signal for the stereo CODEC at higher frequencies. The multiplexer 28 supplies a cbck signal from the multiplexer 27 or the divider 24 to the PLL synthesiser 36 of the application processor 6 and the camera 7.

For voice, the following combinations are supported

| System Clock | Word Clock |
|---|---|
| 13M / 15.36M | 8 K |

For stereo audio use the following combinations are supported

| System Clock | Word Clock |
| --- | --- |
| 13M / 15.36M | 48.000 K |
| 13M / 15.36M | 44.100 K |
| 13M / 15.36M | 32.000 K |
| 13M / 15.36M | 24.000 K |
| 13M / 15.36M | 22.050 K |
| 13M / 15.36M | 16.000 K |
| 13M / 15.36M | 12.000 K |
| 13M / 15.36M | 11.025 K |
| 13M / 15.36M | 08.000 K |

Also, for the Universal Serial Bus (USB), there is a need to generate a clock at 48 Mhz with a low clock jitter less than 100 ps. This clock is derived also from the clock source 14 and 24. This clock has low jitter since it is directly from the crystal clock 14.

The Blue Tooth module 5 includes a fractional-N PLL frequency synthesiser that receives a clock signal from divider 23 in the synthesiser module 15 and to which an AFC correction is applied derived from the signal received from the master terminal in the local area network of the Blue Tooth system, this clock signal being used for the transmitter and receiver sections. The local area network may include a headset with earphones used for sound output and a microphone for sound input and coupled to the power and audio management section. The Blue Tooth module may also provide communications with a printer in the local area network, for example, communicating with a personal digital assistant (PDA) in the application processor. The Blue Tooth module 5 also includes a fractional-N PLL synthesiser 40 that produces a 24 MHz clock signal from the clock signal of divider 23 with AFC to the Blue Tooth master station signal, and a divider 41 that derives an 8 MHz clock signal from the output of the synthesiser element 40, the 8 MHz clock signal being supplied to the Blue Tooth application element 31 in the application processor module 6.

The GPS module 8 includes a fractional-N PLL synthesiser 42 that produces a clock signal from the clock signal of divider 21 with AFC to the received signal from the GPS satellites.

It will be appreciated that all the modules 1, 4, 5, 6, 8, 15 and 16 include fractional-N PLL synthesiser elements, the primary reference signal for which is the common crystal oscillator 14. Each of these modules is selectively activated or de-activated, so that the power consumption of the frequency synthesiser element associated is only incurred when the corresponding application is operational. Different modes of partial operation are possible as summarised in the following table.

Each synthesizer (17, 18, 19, 25, 26, 41, 42) has the capability to perform digital Automatic frequency correction (AFC) independently to provide frequency values, the AFC for GSM being different from the AFC for Bluetooth or for GPS, for example. The use of fractional-N PLL synthesizers allows high resolution of frequency adjustment for the digital AFC capabilities.

FIGS. 3 to 10 show examples of clock generation in partial operation of the terminal.

Figure 3:
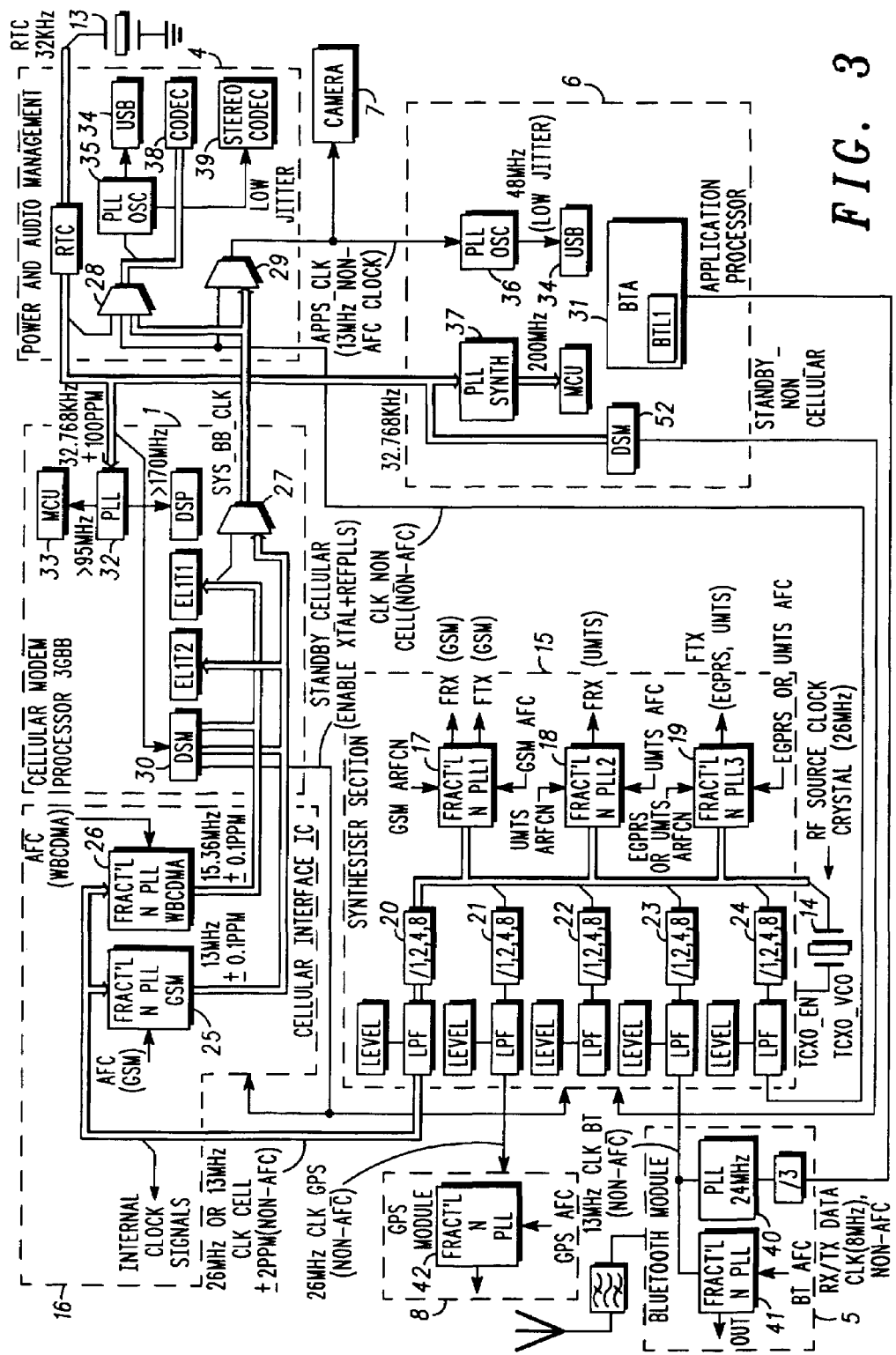
FIG. 3 is a block schematic diagram showing the clock generation of the terminal of FIG. 2 in a mode in which a GSM application in a telephony module is active for voice communication and a WBCDMA application in the telephony module is on standby (monitoring)

In FIG. 3, the GSM application in the cellular telephony module is active for voice communication and the WBCDMA application is on standby. The reference frequency signal at 26 MHz from the divider 20 is supplied to the fractional-N PLL synthesizers 25 and 26 in the cellular interface module 16, which supply square wave clock signals at 13 MHz and 15.36 MHz respectively to a precision of ±0.1 ppm. The multiplexers 27 and 28 select the 13 MHz clock signal for the voice Codec 38. The 32 kHz clock signal is supplied to the deep sleep manager 52 and the PLL frequency synthesizer 37 for the micro-controller unit of the application processor 6.

Figure 4:
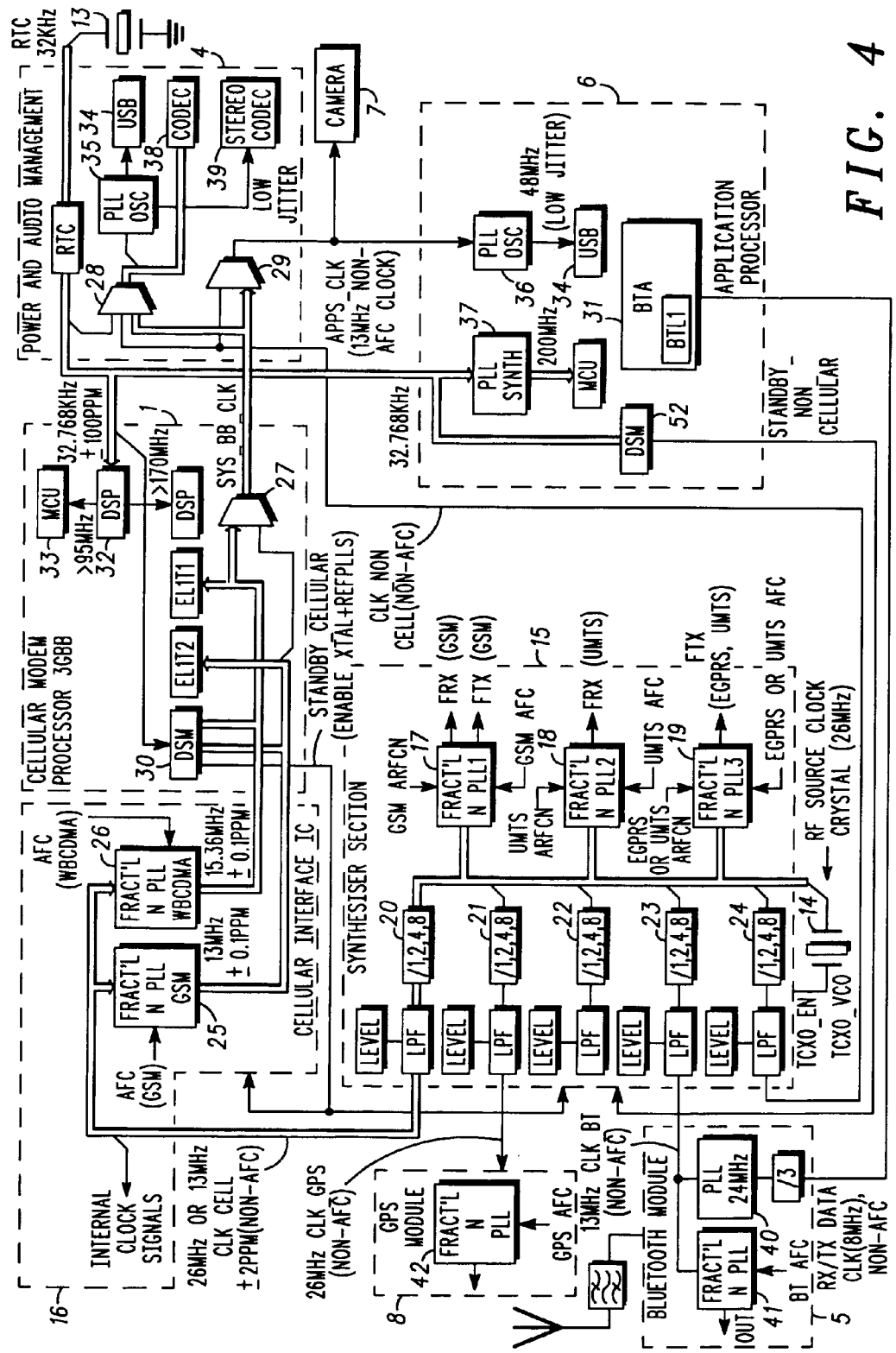
FIG. 4 is a block schematic diagram showing the clock generation of the terminal of FIG. 2 in a mode in which the GSM telephony application is monitoring and the WBCDMA telephony application is active for voice communication.

In FIG. 4, the GSM telephony application is monitoring and the WBCDMA telephony application is active for voice communication. The reference frequency signal at 26 MHz from the divider 20 is supplied to the fractional-N PLL synthesizers 25 and 26 in the cellular interface module 16, which supply square wave clock signals at 13 MHz and 15.36 MHz respectively to a precision of ±0.1 pm. The multiplexers 27 and 28 select the 15.36 MHz clock signal for the voice Codec 38. The 32 kHz clock signal is supplied to the deep sleep manager 52 and the PLL frequency synthesizer 37 for the micro-controller unit of the application processor 6.

In both the cases of FIGS. 3 and 4, the frequency synthesizers for the standby telephone application may be energised only intermittently.

Figure 5:
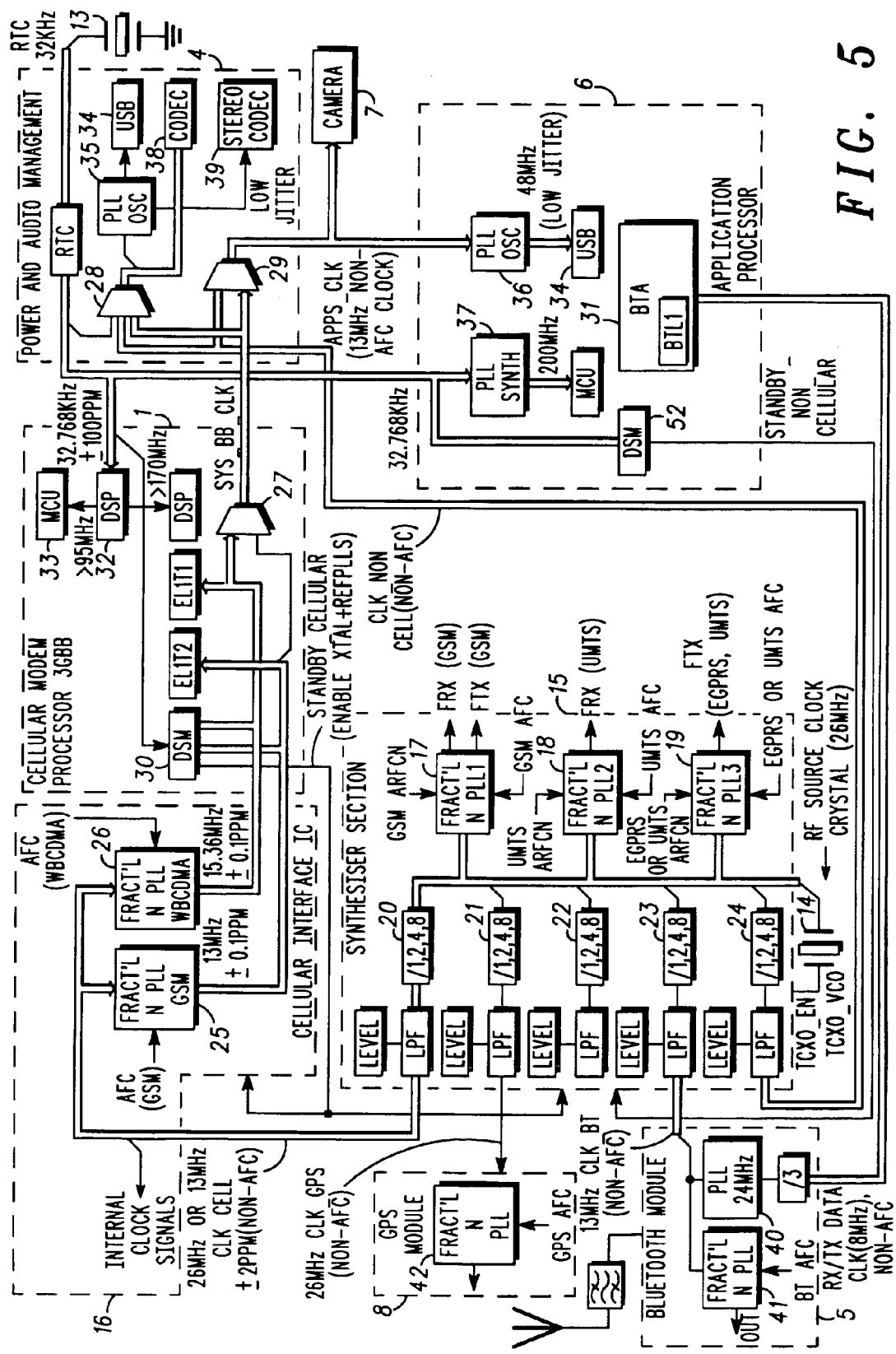
FIG. 5 is a block schematic diagram showing the clock generation of the terminal of FIG. 2 in a mode in which the WBCDMA application is active for voice and video communication, a video camera and the USB are active, and a Bluetooth module is active to couple a headset for the voice communication.

In FIG. 5, the WBCDMA application is active for voice and video communication, the video camera 7 and the USB 34 are active, and the Bluetooth module 5 is active to couple a headset for the voice communication. The reference frequency signal at 26 MHz from the divider 20 is supplied to the fractional-N PLL synthesizers 25 and 26 in the cellular interface module 16, which supply square wave clock signals at 13 MHz and 15.36 MHz respectively to a precision of ±0.1 ppm. The multiplexers 27 and 28 select the 15.36 MHz clock signal for the voice Codec 38. The multiplexers 29 selects the 15.36 MHz clock signal for the camera 7, and the divider 36 for the USB 34. The Blue Tooth module 5 receives the reference frequency sine signal from the divider 23 and the divider 41 supplies the 8 MHz clock signal to the Blue Tooth application 31. The 32 kHz clock signal is supplied to the deep sleep manager 52 and the PLL frequency synthesizer 37 for the micro-controller unit of the application processor 6.

Figure 6:
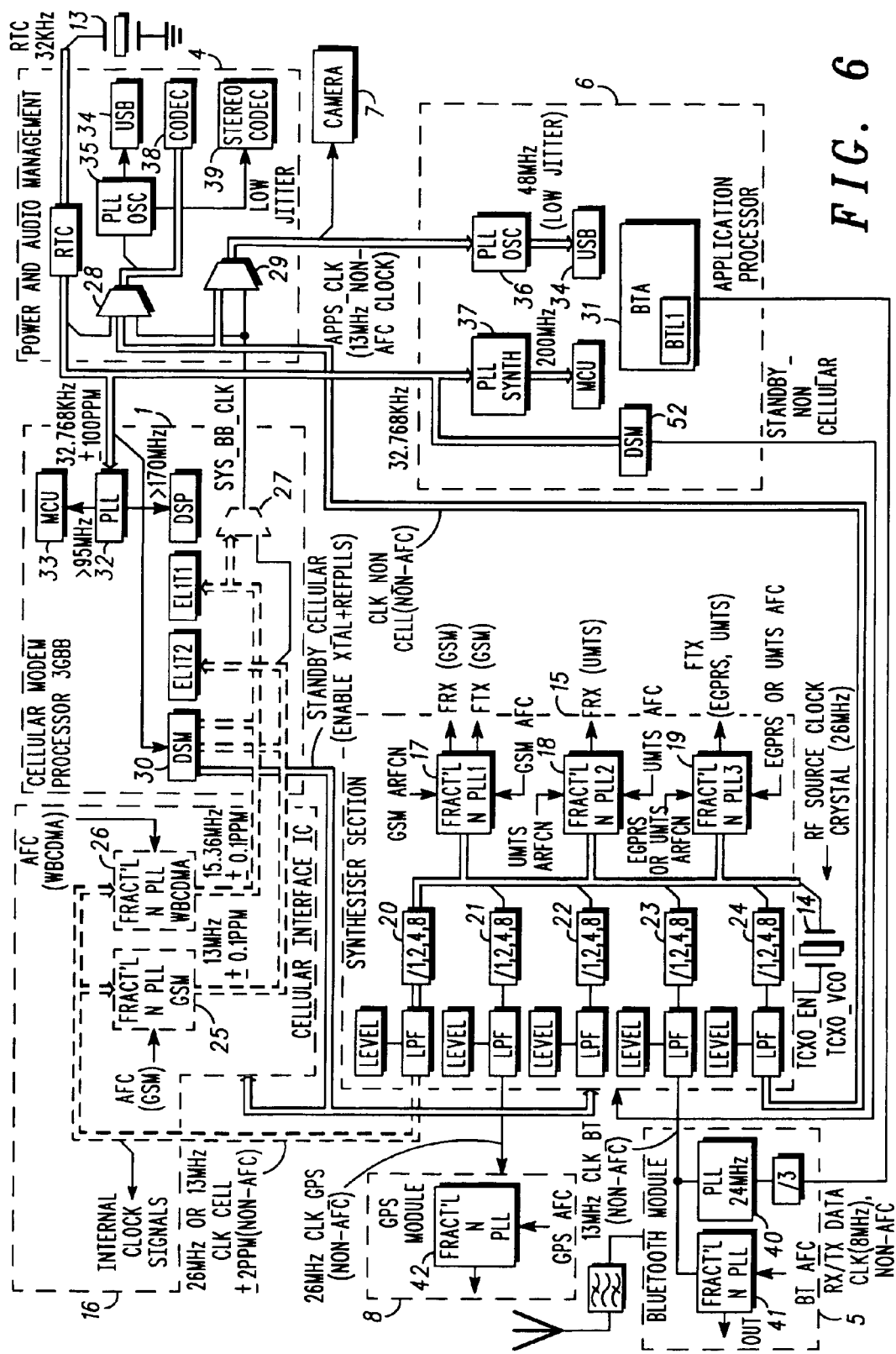
FIG. 6 is a block schematic diagram showing the clock generation of the terminal of FIG. 2 in a mode in which the GSM and WBCDMA telephony module is on standby (monitoring), with an organiser ('PDA') module active using a USB connection.

In FIG. 6, the GSM and WBCDMA telephony module is on standby (monitoring), with the organiser ('PDA') module active using a USB connection. A standby signal from the deep sleep manager 30 controls the intermittent operation of the cellular interface 16 and the cellular modem processor 1. The reference frequency signal at 26 MHz from the divider 20 is supplied to the fractional-N PLL synthesizers 25 and 26 in the cellular interface module 16, which are intermittently awoken to supply square wave clock signals at 13 MHz and 15.36 MHz respectively to a precision of ±0.1 ppm. The multiplexer 28 and 29 select the non-AFC 13 MHz frequency reference sine signal from the divider 24 for the voice Codec 38 and for the divider 36 for the USB 34, respectively.

Figure 7:
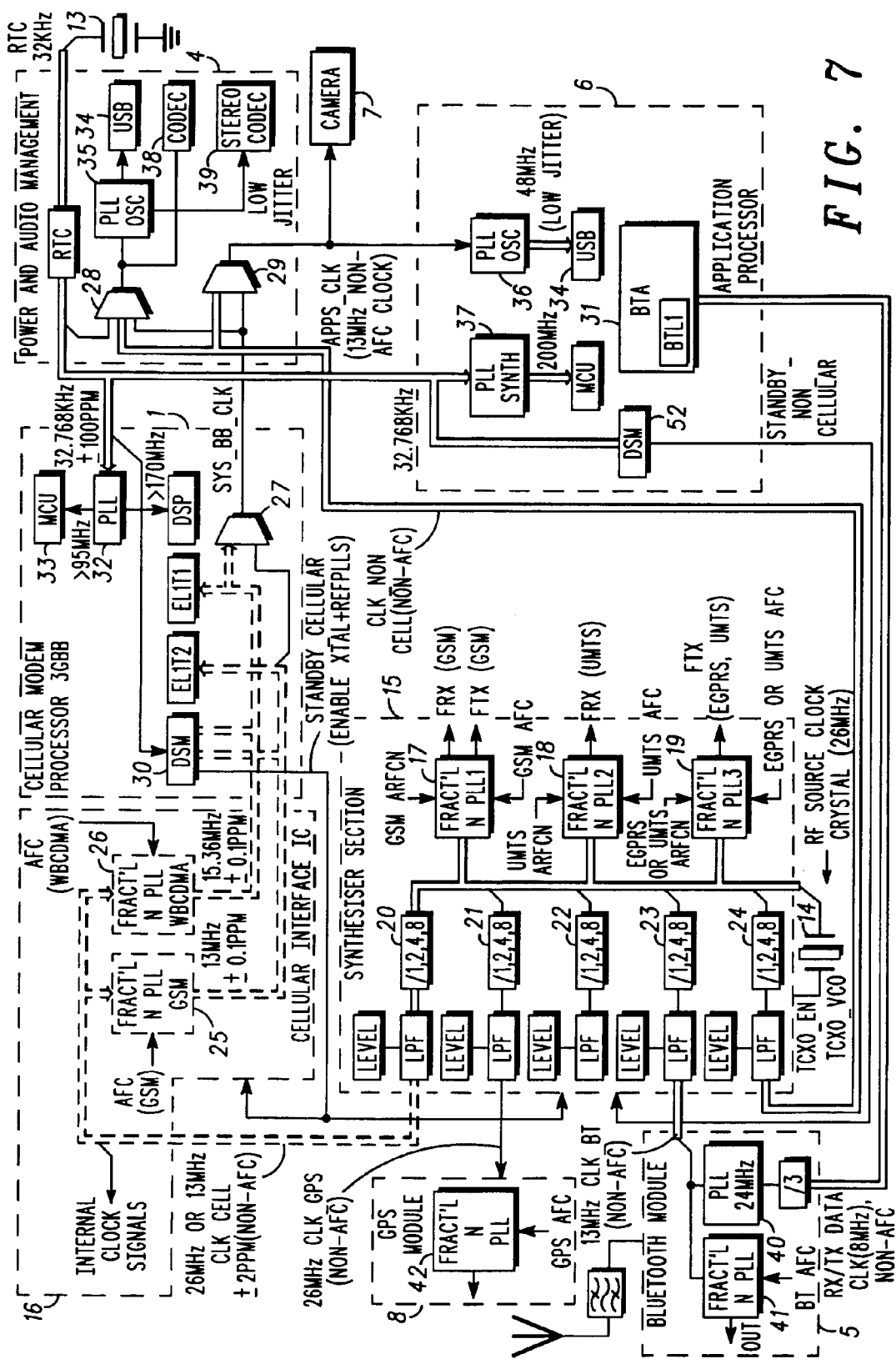
FIG. 7 is a block schematic diagram showing the clock generation of the terminal of FIG. 2 in a mode in which the GSM and WBCDMA telephony module is on standby, the Bluetooth module is active to couple an MP3 player and a stereo (high fidelity) audio coder/decoder is active.

In FIG. 7, the GSM and WBCDMA telephony module is on standby, the Bluetooth module is active to couple an MP3 player and the stereo (high fidelity) audio coder/decoder 39 is active. The cellular interface 16 and cellular modem processor 1 are awoken intermittently, as in FIG. 6 and the Blue Tooth module 5 receives the reference frequency sine signal from the divider 23 and the divider 41 supplies the 8 MHz clock signal to the Blue Tooth application 31. The 32 kHz clock signal is supplied to the deep sleep manager 52 and the PLL frequency synthesizer 37 for the micro-controller unit of the application processor 6.

Figure 8:
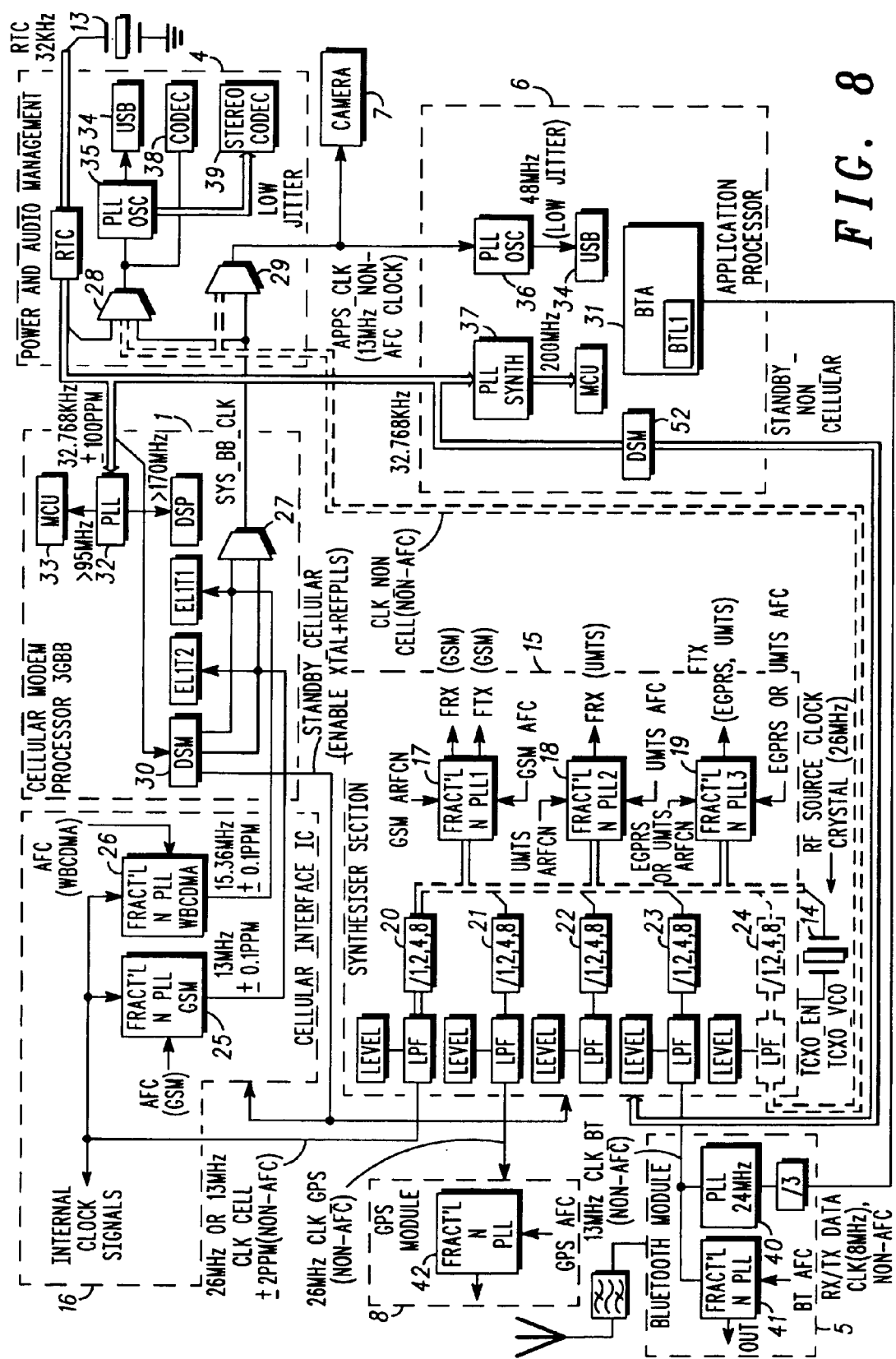
FIG. 8 is a block schematic diagram showing the clock generation of the terminal of FIG. 2 in a mode in which the GSM and WBCDMA telephony module is switched off and the PDA module is on standby.

In FIG. 8, the GSM and WBCDMA telephony module 1 is switched off and the PDA module is on standby. The cellular interface 16 is switched off. The deep sleep manager 52 applies a standby signal to awaken the crystal controlled oscillator 14 and the divider 24 intermittently. The frequency synthesizers 17, 18 and 19 are switched off. The 32 kHz clock signal is supplied to the deep sleep manager 52 and the PLL frequency synthesizer 37 for the micro-controller unit of the application processor 6.

Figure 9:
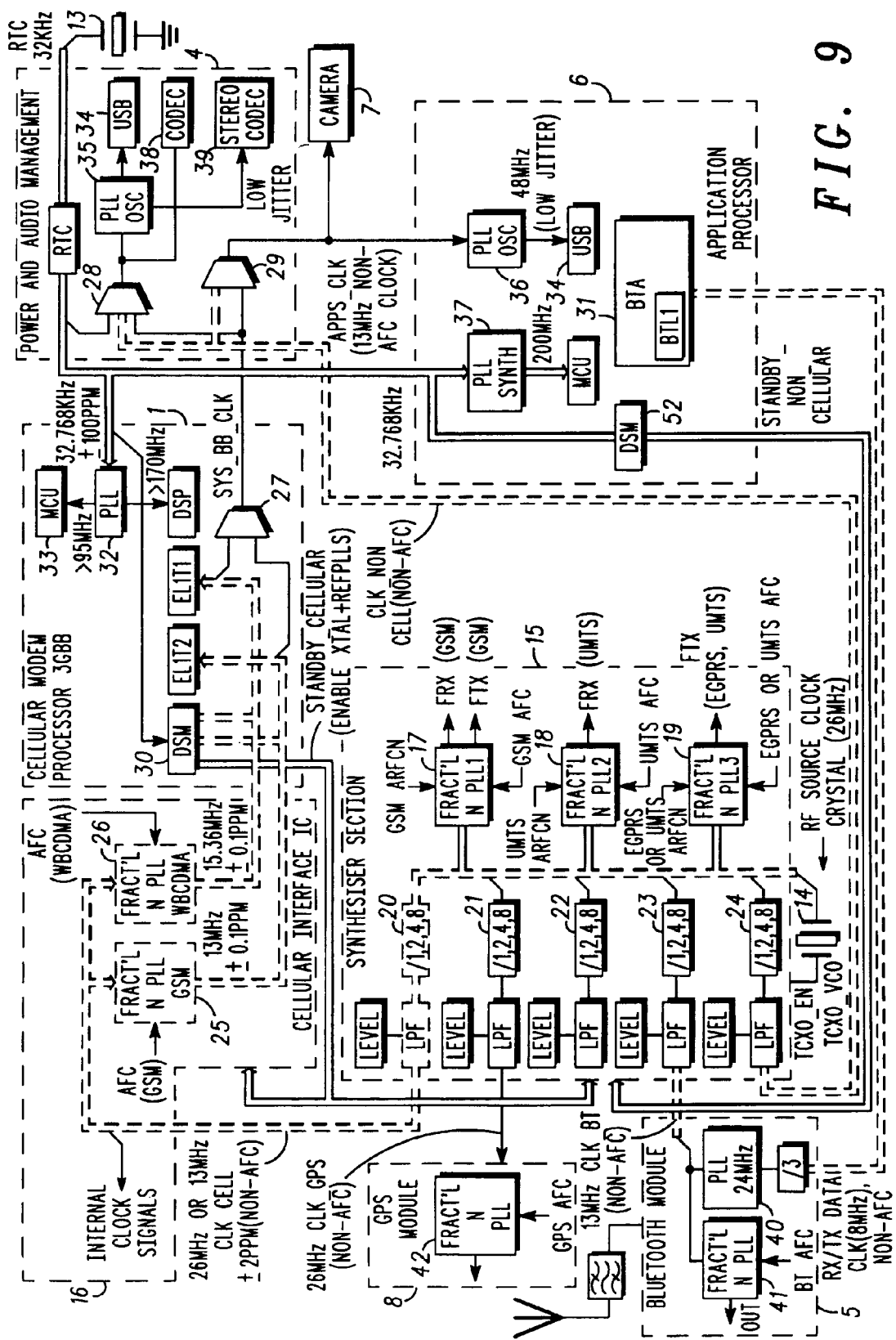
FIG. 9 is a block schematic diagram showing the clock generation of the terminal of FIG. 2 in a mode in which the GSM and WBCDMA telephony module, the Bluetooth module and the PDA module are on standby.

In FIG. 9, the GSM and WBCDMA telephony module, the Bluetooth module and the PDA module are on standby. The deep sleep manager 52 applies a standby signal to awaken intermittently the crystal controlled oscillator, the cellular interface 16, the frequency synthesizers 17, 18 and 19 and the dividers 20, 23 and 24. The 32 kHz clock signal is supplied to the deep sleep manager 52 and the PLL frequency synthesizer 37 for the micro-controller unit of the application processor 6.

Figure 10:
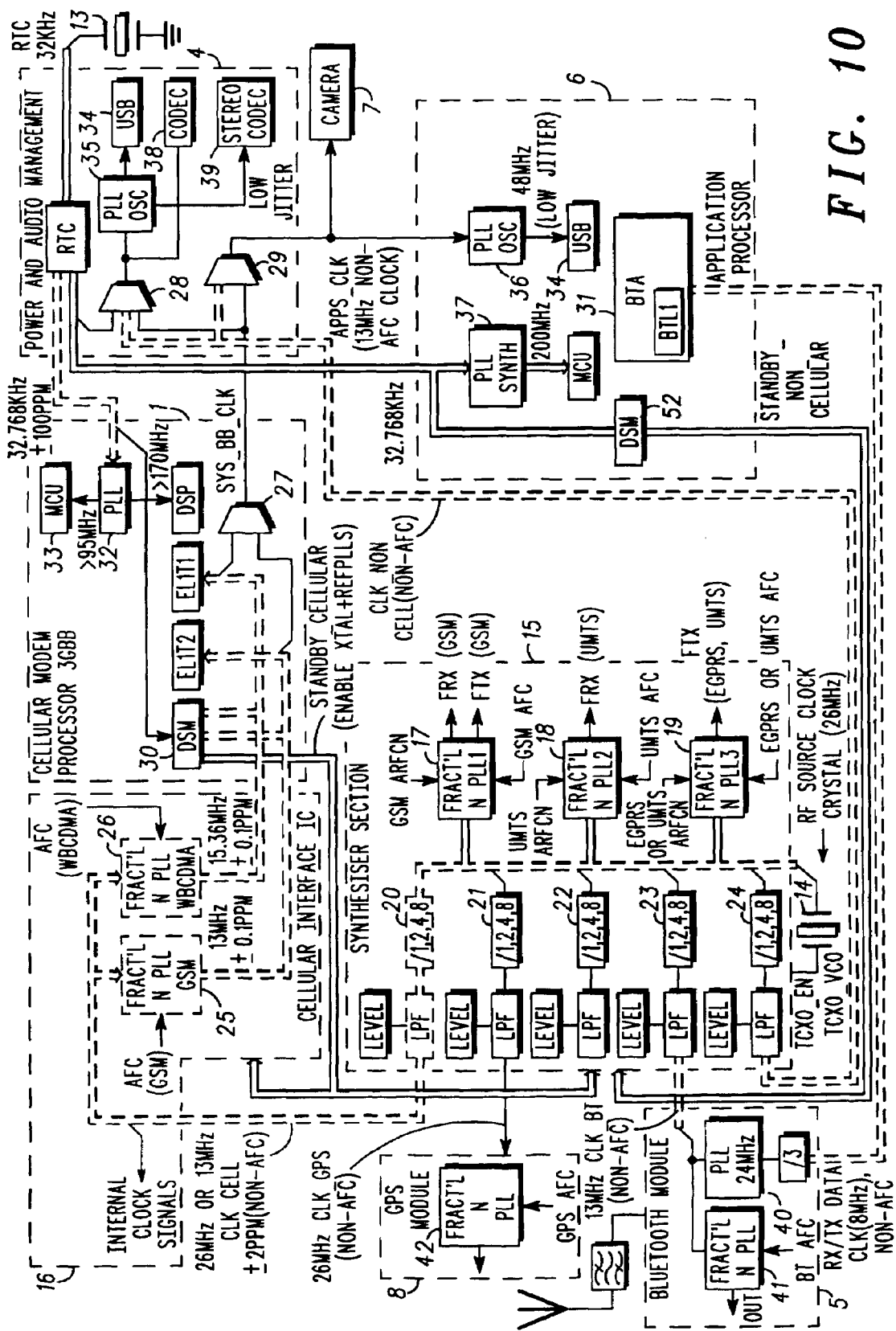
FIG. 10 is a block schematic diagram showing the clock generation of the terminal of FIG. 2 in a mode with only tie PDA module active and with the Bluetooth module on standby.

In FIG. 10, only the PDA module is active and the GSM and WBCDMA telephony module and the Bluetooth module are on standby. The deep sleep manager 52 applies a standby signal to awaken intermittently the crystal controlled oscillator, the cellular interface 16, the frequency synthesizers 17, 18 and 19 and the dividers 20, 23 and 24. The 32 kHz clock signal is supplied continuously to the deep sleep manager 52 and the PLL frequency synthesizer 37 for the micro-controller unit of the application processor 6 but only intermittently to the PLL synthesizer 32.

Figure 11:
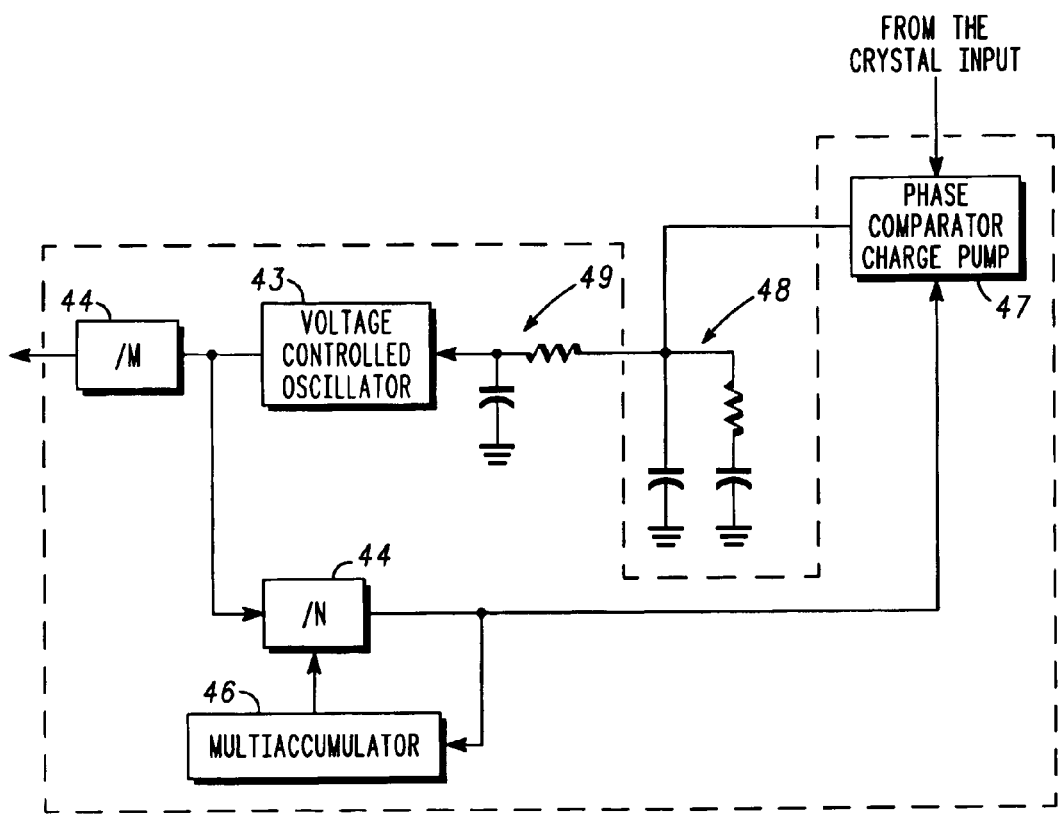
FIG. 11 is a schematic diagram of a multi-accumulator PLL frequency synthesizer in the terminal of FIG. 2.

The frequency synthesiser elements 17, 18 and 19 may be of the kind including multi-accumulator elements as described in U.S. Pat. No. 5,493,700. However, in the preferred embodiment of the present invention, each of the reference PLL frequency synthesizers 25 and 26 is of the kind shown in FIG. 11, which comprises a voltage-controlled oscillator ('VCO') 43, whose output signal is supplied to a frequency divider 44 that divides the frequency of the VCO by an integer factor M to obtain the PLL frequency synthesizer output signal. The output signal of the VCO 43 is also supplied to a frequency divider 45 that divides the frequency of the VCO by an integer factor N, the frequency divider 45 being connected in a feedback loop. The frequency divider 45 includes a multi-accumulator section 46 that enables the factor N to be selected and to which the digital AFC may be applied. The phase of the output signal from the frequency divider 45 is compared with the phase of the frequency reference from the crystal controlled oscillator 14 in a phase comparator charge pump device 47. The phase comparator charge pump device 47 supplies resistor-capacitor circuits 48 and 49 that supply a correction signal to the VCO 43 that is a function of the difference in phase between the signals from the divider 45 and the crystal-controlled oscillator 14.

The invention claimed is:

1. Wireless communication terminal for generating a plurality of radio frequency clock signals, for use by a plurality of application modules including at least one wireless communication module that comprises transmitter and receiver means for wireless communication and further application modules said clock signals having respective clock frequency characteristics and including at least first and second clock frequencies that are not integral multiples nor sub-multiples of each other nor of a third frequency, said wireless communication terminal comprising reference frequency means and fractional-N phase-locked loop frequency synthesizer means responsive to said reference frequency means, and automatic frequency control means for adjusting clock frequencies relative to received signals, wherein said reference frequency means is arranged to supply a common reference frequency signal to a plurality of said fractional-N phase-locked loop frequency synthesizer means that supply said first and second clock frequencies respectively for said application modules said wireless communication terminal comprising selective activation means for selectively activating and de-activating at least one of said plurality of phase lock loop means as required by the corresponding application module or modules, and at least one of said frequency synthesizer means having a synchronisation value different from the synchronisation value of the other frequency synthesizer means.

2. Wireless communication terminal as claimed in claim 1, wherein said frequency synthesizer means include programmable frequency divider means.

3. Wireless communication terminal of claim 1, wherein said respective clock frequency characteristics include respective clock frequency precision tolerances.

4. Wireless communication terminal of claim 1, wherein at least one of said frequency synthesizer means comprises synchroniser means for synchronising the corresponding clock signal with a frequency of a received wireless communication signal, said selective activation means being arranged to activate and de-activate selectively said synchroniser means and the corresponding application module or modules.

5. Wireless communication terminal of claim 1, wherein said selective activation means is arranged to activate at least one of said frequency synthesizer means at intervals during a standby phase of the corresponding application module.

6. Wireless communication terminal of claim 1, comprising two of said selective activation means both enabled to activate the reference frequency sources.

7. Wireless communication terminal as claimed in claim 6, wherein said selective de-activation means are arranged to de-activate a given reference frequency source only if both of the selective de-activation signal de-activation of that source.

8. Wireless communication terminal of claim 1, wherein said transmitter and receiver means includes first and second wireless communication means for wireless communication according to first and second standards respectively, said transmitter and receiver means being responsive to said first and second clock signals for said first and second standards respectively.

9. Wireless communication terminal as claimed in claim 8, wherein said first wireless communication means comprises a wireless telephony application and said second wireless communication means comprises a data transmission application.

10. Wireless communication terminal of claim 1, wherein at least a second one of said application modules comprises base-band signal processing means for processing signals from more than one other application, said selective activation means supplying different clock signals to said base-band signal processing means depending on the application whose signals it is processing.

11. Wireless communication terminal of claim 1, and including further reference frequency means defining at least one reference frequency substantially lower than radio frequency and further fractional-N phase-locked loop frequency synthesizer means responsive to said further reference frequency means said selective activation means being arranged to activate and de-activate selectively said further phase lock loop means as required by the corresponding application.

12. Wireless communication terminal as claimed in claim 11, wherein said further reference frequency means is arranged to deliver two outputs, one for said wireless communication module and one for said further application modules, and wherein said output for said wireless communication module may be disabled or enabled by the application processor.

13. Wireless communication terminal for generating a plurality of radio frequency clock signals, for use by a plurality of application modules including at least one wireless communication module that comprises transmitter and receiver means for wireless communication and further application modules, said clock signals having respective clock frequency characteristics and including at least first and second clock frequencies that are not integral multiples nor sub-multiples of each other nor of a third frequency, said wireless communication terminal comprising reference frequency means and fractional-N phase-locked loop frequency synthesizer means responsive to said reference frequency means, and automatic frequency control means for adjusting clock frequencies relative to received signals, wherein said reference frequency means is arranged to supply a common reference frequency signal to a plurality of said fractional-N phase-locked loop frequency synthesizer means that supply said first and second clock frequencies respectively for said application modules said wireless communication terminal comprising selective activation means for selectively activating and de-activating at least one of said plurality of phase lock loop means as required by the corresponding application module or modules, and wherein at least one of said frequency synthesizer means produces a reference frequency without synchronising the corresponding clock signal with a frequency of a received wireless communication signal.

14. Wireless communication terminal as claimed in claim 13, wherein said frequency synthesizer means include programmable frequency divider means.

15. Wireless communication terminal of claim 13, wherein said respective clock frequency characteristics include respective clock frequency precision tolerances.

16. Wireless communication terminal of claim 13, wherein at least one of said frequency synthesizer means comprises synchroniser means for synchronising the corresponding clock signal with a frequency of a received wireless communication signal, said selective activation means being arranged to activate and de-activate selectively said synchroniser means and the corresponding application module or modules.

17. Wireless communication terminal of claim 13, wherein said selective activation means is arranged to activate at least one of said frequency synthesizer means at intervals during a standby phase of the corresponding application module.

18. Wireless communication terminal of claim 13, comprising two of said selective activation means both enabled to activate the reference frequency sources.

19. Wireless communication terminal as claimed in claim 18, wherein said selective de-activation means are arranged to de-activate a given reference frequency source only if both of the selective de-activation means signal de-activation of that source.

20. Wireless communication terminal as claimed in claim 19, wherein said first wireless communication means comprises a wireless telephony application and said second wireless communication means comprises a data transmission application.

21. Wireless communication terminal of claim 13, wherein said transmitter and receiver means includes first and second wireless communication means for wireless communication according to first and second standards respectively, said transmitter and receiver means being responsive to said first and second clock signals for said first and second standards respectively.

22. Wireless communication terminal of claim 13, wherein at least a second one of said application modules comprises base-band signal processing means for processing signals from more than one other application, said selective activation means supplying different clock signals to said base-band signal processing means depending on the application whose signals it is processing.

23. Wireless communication terminal as claimed in claim 22, wherein said further reference frequency means is arranged to deliver two outputs, one for said wireless communication module and one for said further application modules, and wherein said output for said wireless communication module may be disabled or enabled by the application processor.

24. Wireless communication terminal of claim 13, and including further reference frequency means defining at least one reference frequency substantially lower than radio frequency and further fractional-N phase-Locked loop frequency synthesizer means responsive to said further reference frequency means, said selective activation means being arranged to activate and de-activate selectively said further phase lock loop means as required by the corresponding application.

* * * * *